(12) United States Patent
Sugimura

(10) Patent No.: US 10,930,981 B2
(45) Date of Patent: Feb. 23, 2021

(54) SEMICONDUCTOR DEVICE AND BATTERY MONITORING SYSTEM

(71) Applicant: LAPIS SEMICONDUCTOR CO., LTD., Kanagawa (JP)

(72) Inventor: Naoaki Sugimura, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/890,199

(22) Filed: Jun. 2, 2020

(65) Prior Publication Data
US 2020/0295409 A1 Sep. 17, 2020

Related U.S. Application Data

(63) Continuation-in-part of application No. 16/018,222, filed on Jun. 26, 2018, now Pat. No. 10,705,148.

(30) Foreign Application Priority Data

Jun. 29, 2017 (JP) ................................. 2017-127634

(51) Int. Cl.
*G01R 31/3835* (2019.01)
*H01M 10/42* (2006.01)

(52) U.S. Cl.
CPC ...... *H01M 10/425* (2013.01); *G01R 31/3835* (2019.01); *H01M 2010/4271* (2013.01)

(58) Field of Classification Search
CPC .............. G01R 31/396; G01R 31/3644; G01R 31/3842
See application file for complete search history.

(56) References Cited

U.S. PATENT DOCUMENTS

2012/0081167 A1* 4/2012 Ban ...................... H02J 7/0021
327/333
2015/0323609 A1* 11/2015 Kudo ...................... G01R 1/28
324/433

FOREIGN PATENT DOCUMENTS

JP 2012-151941 A 8/2012

* cited by examiner

*Primary Examiner* — Tung X Nguyen
(74) *Attorney, Agent, or Firm* — Volentine, Whitt & Francos, PLLC

(57) ABSTRACT

A semiconductor device includes: a boosting section configured to output a second voltage boosted from a first voltage; a voltage lowering section configured to output a lowered voltage that has been lowered from the second voltage by a predetermined voltage; a first buffer amp including a non-inverting input terminal connected to an output of the voltage lowering section; a second buffer amp including a non-inverting input terminal that is input with the first voltage; and a difference output section configured to output a voltage corresponding to a difference between output of the first buffer amp and output of the second buffer amp.

4 Claims, 6 Drawing Sheets

SEMICONDUCTOR DEVICE AND BATTERY MONITORING SYSTEM

CROSS-REFERENCE TO RELATED APPLICATION

This is a Continuation Application of application Ser. No. 16/018,222, filed Jun. 26, 2018, now U.S. Pat. No. 10,705,148 issued on Jul. 7, 2020, which claims priority under 35 USC 119 from Japanese Patent Application No. 2017-127634, filed on Jun. 29, 2017, the disclosure of which is incorporated by reference herein.

BACKGROUND

Technical Field

The present disclosure relates to a semiconductor device and a battery monitoring system.

Related Art

Generally, related battery monitoring systems monitor battery cells by using a semiconductor device to measure the cell voltage of each of plural battery cells installed in a vehicle or the like. Some conventional semiconductor devices include a boosting section that generates a boost voltage by boosting a power source voltage in accordance with a cell voltage of a battery cell or the like.

For example, in such conventional semiconductor devices, sometimes a difference output section is input with a high potential side cell voltage and a low potential side cell voltage of a battery cell, and the cell voltage of the battery cell is measured based on the difference between the two cell voltages, as output from the difference output section. Note that technology to improve the precision of cell voltage measurement by inputting the respective cell voltages to the difference output section via buffer amps, exists. A boost voltage boosted by a boosting section is employed as a power source voltage of the buffer amps in order to stabilize operation of the buffer amps.

Conventional technology for diagnosing an operational state of such a boosting section exists, namely for diagnosing whether or not an input voltage has been boosted appropriately.

For example, Japanese Patent Application Laid-Open (JP-A) No. 2012-151941 discloses a voltage boosting system that may diagnose a booster section that generates a boost voltage by boosting a first voltage in accordance with a second voltage. The voltage boosting system includes a comparison circuit that compares a difference value between the boost voltage and the first voltage against a difference value between the second voltage and a ground potential, and outputs comparison results, or that compares a difference value between the boost voltage and the second voltage against a difference value between the first voltage and the ground potential, and outputs comparison results.

In addition to diagnosing an operational state of the boosting section, the technology disclosed in JP-A No. 2012-151941 can be also applied to diagnose an operational state of a semiconductor device. For example, application may be made to diagnose a supply state of a power source voltage to a buffer amps provided to the semiconductor device. In such cases, instead of comparing boost voltages, diagnosis can be performed using comparison results obtained by using the comparison circuit to compare voltages at nodes connected to a power source line that supplies the power source voltage to the buffer amp.

In such cases, plural devices within the buffer amp are connected to the power source line. Therefore, instead of comparing the boost voltages, it is necessary to use the comparison circuit to compare the voltage at each node connected to the power source line for each of the plural devices in sequence.

Since it is necessary to compare each of the plural devices with the comparison circuit, diagnosis may be time-consuming.

Moreover, configuration to switch the voltage input to the comparison circuit is required. For example, in cases in which a switch is provided to switch the voltage input to the comparison circuit between the boost voltage and the voltage of any of the respective nodes where the plural devices are connected to the power source line, a semiconductor device (battery monitoring system) including such configuration is required. This might, for example, create the issue of an increase in the surface area (circuit scale) of the semiconductor device.

SUMMARY

The present disclosure provides a semiconductor device and a battery monitoring system that may diagnose an operational state of the semiconductor device in shorter time and with simple configuration.

A first aspect of the present disclosure is a semiconductor device including: a boosting section configured to output a second voltage boosted from a first voltage; a voltage lowering section configured to output a lowered voltage that has been lowered from the second voltage by a predetermined voltage; a first buffer amp including a non-inverting input terminal connected to an output of the voltage lowering section; a second buffer amp including a non-inverting input terminal that is input with the first voltage; and a difference output section configured to output a voltage corresponding to a difference between output of the first buffer amp and output of the second buffer amp.

A second aspect of the present disclosure is a battery monitoring system including: a battery cell assembly including plural battery cells connected in series; the semiconductor device of the first aspect connected to the battery cell assembly and measuring a cell voltage of each of the plurality of battery cells; and a control device configured to output to the semiconductor device an instruction signal to instruct cell voltage measurement of each of the plural battery cells, and an instruction signal to instruct diagnosis of an operational state of the semiconductor device.

According to the above aspects, the semiconductor device and the battery monitoring system of the present disclosure may diagnose an operational state of a semiconductor device shorter time and with simple configuration.

BRIEF DESCRIPTION OF THE DRAWINGS

Exemplary embodiments will be described in detail based on the following figures, wherein.

DETAILED DESCRIPTION

Detailed explanation follows regarding exemplary embodiments, with reference to the drawings.

First Exemplary Embodiment

Figure 1:
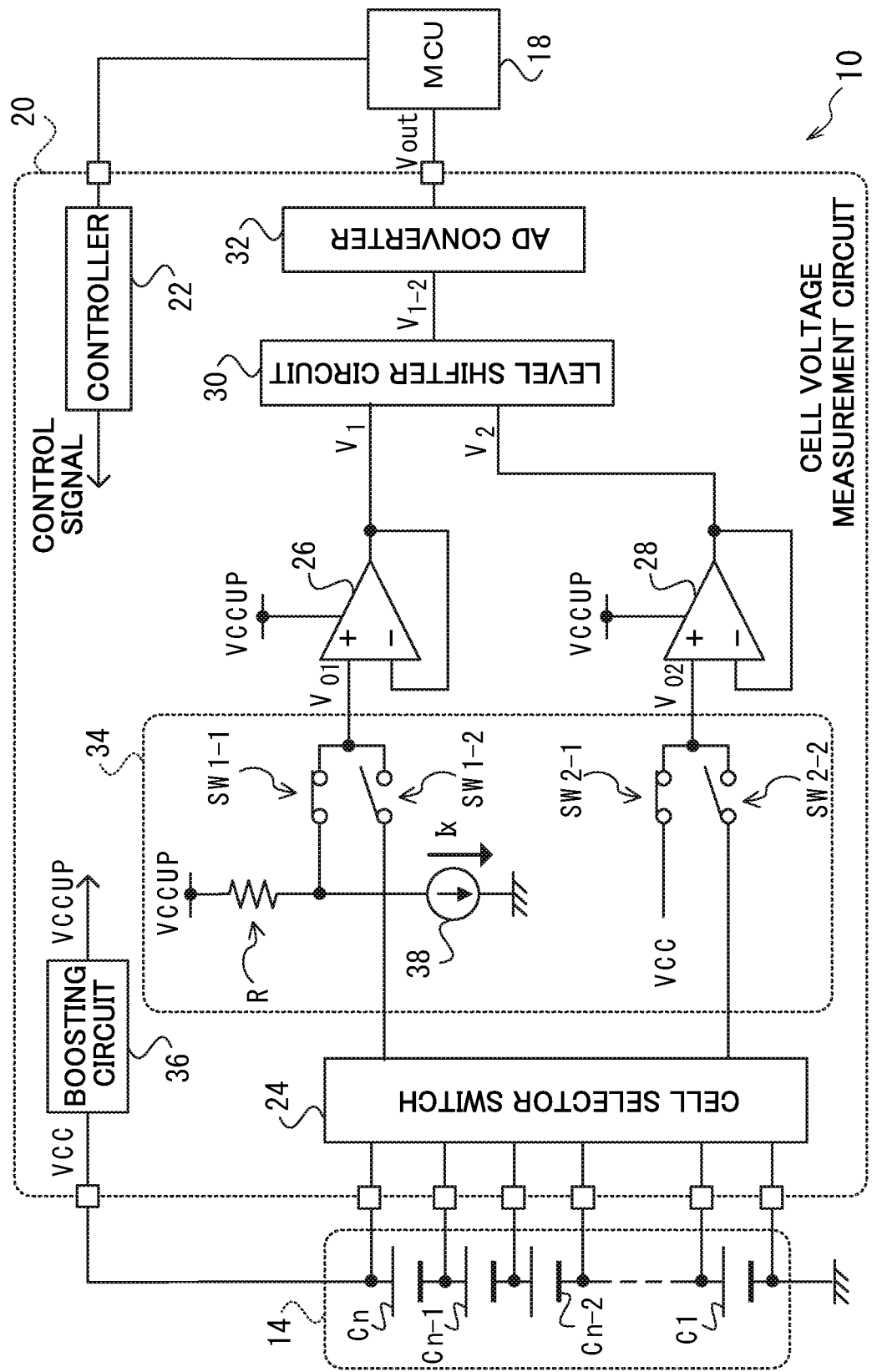
FIG. 1 is a configuration diagram illustrating configuration of a battery monitoring system of a first exemplary embodiment.

First, explanation follows regarding configuration of a battery monitoring system 10 of an exemplary embodiment. FIG. 1 is a configuration diagram illustrating the battery monitoring system 10 of the present exemplary embodiment.

As illustrated in FIG. 1, the battery monitoring system 10 of the present exemplary embodiment includes a battery cell assembly 14, a Micro Controller Unit (MCU) 18, and a cell voltage measurement circuit 20. The cell voltage measurement circuit 20 has functionality to measure the cell voltage of battery cells C included in the battery cell assembly 14, in response to control (instructions) from the MCU 18. The battery monitoring system 10 of the present exemplary embodiment may be applied to products employing plural battery cells, for example in an assembled battery. Examples of such products include vehicles, motorcycles, personal computers, and power tools. Note that the cell voltage measurement circuit 20 of the present exemplary embodiment is an example of a semiconductor device of the present disclosure.

The MCU 18 of the present exemplary embodiment controls measurement of the cell voltage of each battery cell C included in the battery cell assembly 14 using the cell voltage measurement circuit 20. Moreover, the MCU 18 of the present exemplary embodiment uses the cell voltage measurement circuit 20 to control diagnosis of abnormalities (or normal operation) in a boosting circuit 36 and a first buffer amp 26 configuring the cell voltage measurement circuit 20. The MCU 18 of the present exemplary embodiment is an example of a controller of the present disclosure.

The battery cell assembly 14 includes n individual battery cells C1 to Cn (referred to collectively as the "battery cells C"), connected in series with the battery cell C1 at the lowermost level and the battery cell Cn at the uppermost level. As illustrated in FIG. 1, each of the battery cells C1 to Cn is connected to the cell voltage measurement circuit 20. A specific example that might employ the battery cells C is a nickel-hydrogen battery or a lithium-ion battery. Note that the number (n) of battery cells C included in the battery cell assembly 14 is not particularly limited.

The cell voltage measurement circuit 20 of the present exemplary embodiment illustrated in FIG. 1 includes a controller 22, a cell selector switch 24, the first buffer amp 26, a second buffer amp 28, a level shifter circuit 30, an Analog to Digital (AD) converter 32, a diagnostic circuit 34, and the boosting circuit 36.

The controller 22 controls the overall cell voltage measurement circuit 20. Accordingly, in response to instruction signals input from the MCU 18, the controller 22 of the present exemplary embodiment outputs control signals in order to measure the cell voltage of the respective battery cells C, and outputs control signals in order to perform diagnosis of the cell voltage measurement circuit 20.

The boosting circuit 36 boosts a voltage VCC input from a high potential side of the top tier (battery cell Cn) of the battery cell assembly 14 to a voltage VCCUP (VCC<VCCUP) and to output the voltage VCCUP, based on a control signal output from the controller 22. The boosting circuit 36 of the present exemplary embodiment is an example of a boosting section of the present disclosure. The voltage VCC of the present exemplary embodiment is an example of a first voltage of the present disclosure, and the voltage VCCUP of the present exemplary embodiment is an example of a second voltage of the present disclosure.

The cell selector switch 24 includes plural switch elements, not illustrated in the drawings. Each of the plural switch elements of the cell selector switch 24 is ON/OFF controlled in response to control signals output from the controller 22, in order to select a battery cell C to be measured from the battery cell assembly 14. A high potential side voltage and a low potential side voltage are respectively output from the selected battery cell C.

The first buffer amp 26 operates using the voltage VCCUP output from the boosting circuit 36 as a power source voltage. An inverting input terminal of the first buffer amp 26 is connected to the output of the first buffer amp 26, and the output of the first buffer amp 26 is connected to the level shifter circuit 30.

A non-inverting input terminal of the first buffer amp 26 is connected to the cell selector switch 24 via the diagnostic circuit 34. In the present exemplary embodiment, when measuring the cell voltage of a battery cell C, the high potential side voltage output through the cell selector switch 24 from the battery cell C to be measured is input to the non-inverting input terminal of the first buffer amp 26 as a voltage $V_{01}$.

The second buffer amp 28 operates using the voltage VCCUP output from the boosting circuit 36 as a power source voltage. An inverting input terminal of the second buffer amp 28 is connected to the output of the second buffer amp 28, and the output of the second buffer amp 28 is connected to the level shifter circuit 30.

A non-inverting input terminal of the second buffer amp 28 is connected to the cell selector switch 24 via the diagnostic circuit 34. In the present exemplary embodiment, when measuring the cell voltage of a battery cell C, the low potential side voltage output through the cell selector switch 24 from the battery cell C to be measured is input to the non-inverting input terminal of the second buffer amp 28 as a voltage $V_{02}$.

The level shifter circuit 30 is connected to the output of the first buffer amp 26 and to the output of the second buffer amp 28, and is input with a voltage $V_1$ output from the first buffer amp 26 and a voltage $V_2$ output from the second buffer amp 28. The level shifter circuit 30 outputs the difference between the voltage $V_1$ and the voltage $V_2$ as a voltage $V_{1-2}$ at a level referenced against the ground potential. The level shifter circuit 30 of the present exemplary embodiment is an example of a difference output section of the present disclosure.

The AD converter 32 outputs a digital value Vout, corresponding to the voltage $V_{1-2}$ output from the level shifter circuit 30, to the exterior of the cell voltage measurement circuit 20. The digital value Vout output from the cell voltage measurement circuit 20 is input to the MCU 18.

The diagnostic circuit 34 of the present exemplary embodiment also has functionality to diagnose an operational state of the boosting circuit 36, and a supply state of the power source voltage (the voltage VCCUP) to the first buffer amp 26 (this is referred to simply as "operational state diagnosis" hereafter). As illustrated in FIG. 1, the diagnostic circuit 34 of the present exemplary embodiment includes a resistor R, a constant current source 38, a switch SW1-1, a switch SW1-2, a switch SW2-1, and a switch SW2-2. One terminal of the resistor R is connected to the output of the boosting circuit 36 (to a power source line that supplies the voltage VCCUP). The other terminal of the resistor R is connected to the constant current source 38, which supplies a current Ix. The resistor R and the constant current source 38 of the present exemplary embodiment are examples of a voltage lowering section of the present disclosure, and the current Ix supplied by the constant current source 38 of the present exemplary embodiment is an example of a predetermined current of the present disclosure.

One terminal of the switch SW1-1 is connected between the resistor R and the constant current source 38 (namely to a connection node between the resistor R and the constant current source 38) and the other terminal of the switch SW1-1 is connected to the non-inverting input terminal of the first buffer amp 26. One terminal of the switch SW1-2 is connected to the cell selector switch 24 (to a signal line supplying the voltage output from the cell selector switch 24), and the other terminal of the switch SW1-2 is connected to the non-inverting input terminal of the first buffer amp 26. The switch SW1-1 and the switch SW1-2 are ON/OFF controlled in response to control signals output from the controller 22. The switch SW1-1 and the switch SW1-2 of the present exemplary embodiment configure an example of a first switching section of the present disclosure.

One terminal of the switch SW2-1 is connected to the input of the boosting circuit 36, and the other terminal of the switch SW2-1 is connected to the non-inverting input terminal of the second buffer amp 28. One terminal of the switch SW2-2 is connected to the cell selector switch 24 (to a signal line supplying the voltage output from the cell selector switch 24), and the other terminal of the switch SW2-2 is connected to the non-inverting input terminal of the second buffer amp 28. The switch SW2-1 and the switch SW2-2 are ON/OFF controlled in response to control signals output from the controller 22. The switch SW2-1 and the switch SW2-2 of the present exemplary embodiment configure an example of a second switching section of the present disclosure.

Next, explanation follows regarding operation of the cell voltage measurement circuit 20 of the present exemplary embodiment. As described above, operation of the cell voltage measurement circuit 20 is based on instruction signals output from the MCU 18. Accordingly, in a case in which the controller 22 of the cell voltage measurement circuit 20 is input with an instruction signal output from the MCU 18, the controller 22 of the present exemplary embodiment executes processing, of which an example is illustrated in FIG. 2.

Figure 2:
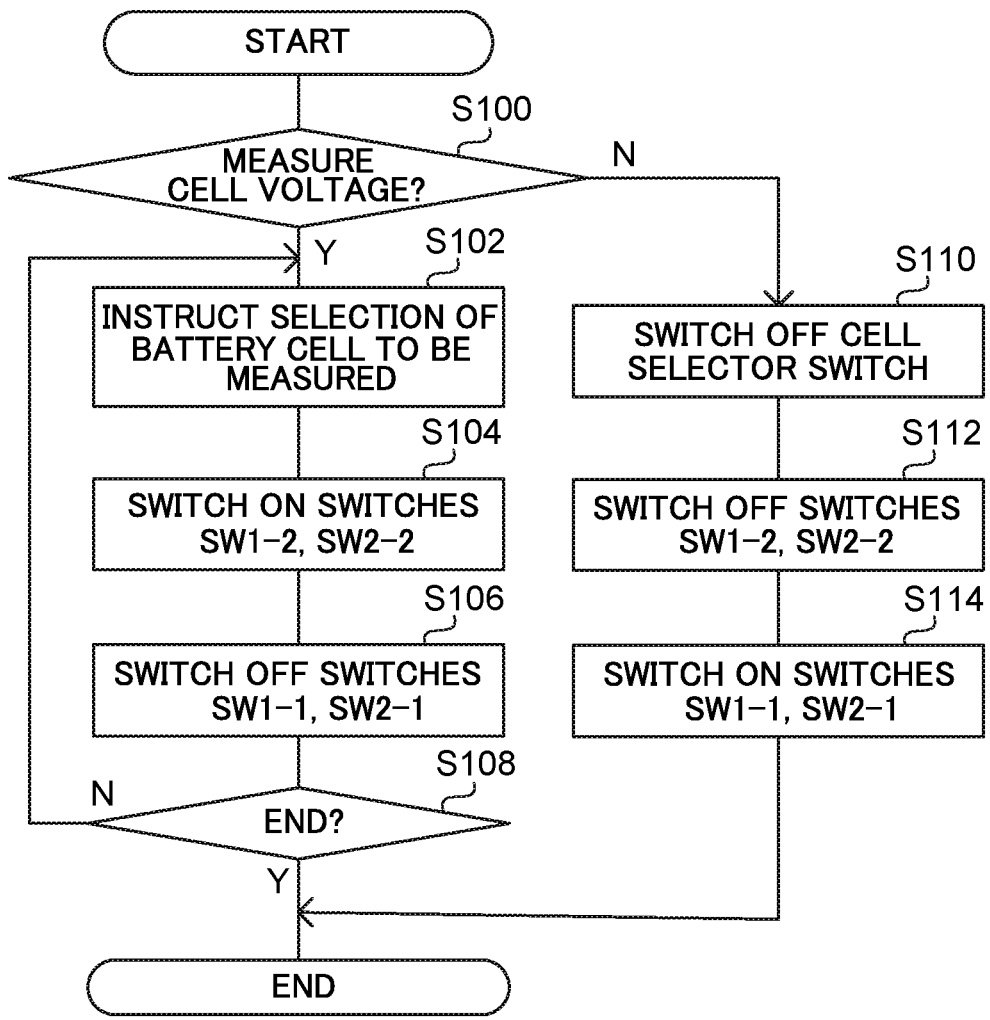
FIG. 2 is a flowchart illustrating a flow of processing of a controller of a cell voltage measurement circuit of the first exemplary embodiment.

At step S100 illustrated in FIG. 2, the controller 22 determines whether or not the input instruction signal is a signal instructing cell voltage measurement. In cases in which the instruction signal is a signal instructing cell voltage measurement, determination is affirmative at step S100, and processing proceeds to step S102.

At step S102, the controller 22 outputs a control signal to the cell selector switch 24 to instruct selection of a battery cell C to be measured.

At the next step S104, the controller 22 outputs control signals to the switch SW1-2 and to the switch SW2-2, to place the switch SW1-2 and the switch SW2-2 in an ON state.

At the next step S106, the controller 22 outputs control signals to the switch SW1-1 and the switch SW2-1, to place the switch SW1-1 and the switch SW2-1 in an OFF state.

As a result of steps S102 to S106, the voltage $V_{O1}$ input to the non-inverting input terminal of the first buffer amp 26 is the high potential side voltage of the battery cell C to be measured, output through the cell selector switch 24. Accordingly, the voltage $V_1$ output from the first buffer amp 26 is the high potential side voltage of the battery cell C to be measured. The high potential side voltage of the battery cell C to be measured output through the cell selector switch 24 in the present exemplary embodiment is an example of a third voltage of the present disclosure.

The voltage $V_{O1}$ input to the non-inverting input terminal of the second buffer amp 28 is the low potential side voltage of the battery cell C to be measured, output through the cell selector switch 24. Accordingly, the voltage $V_2$ output from the second buffer amp 28 is the low potential side voltage of the battery cell C to be measured. The low potential side voltage of the battery cell C to be measured output through the cell selector switch 24 of the present exemplary embodiment is an example of a fourth voltage of a present disclosure.

The difference between the voltage $V_1$ and the voltage $V_2$, namely the output voltage $V_{1-2}$ corresponding to the battery cell C to be measured, is output from the level shifter circuit 30 to the AD converter 32. The AD converter 32 outputs the digital value Vout, obtained by converting the output voltage $V_{1-2}$ into a digital value, to the MCU 18.

At the next step S108, the controller 22 determines whether or not to end cell voltage measurement. As an example, in a case in which the MCU 18 instructs cell voltage measurement in the cell voltage measurement circuit 20 of the present exemplary embodiment, the cell voltages of all of the battery cells C included in the battery cell assembly 14 are measured in sequence. Accordingly, the controller 22 determines whether or not the cell voltages of all of the battery cells C have been measured. In cases in which there are still battery cells C for which the cell voltage has not been measured, determination is negative at step S108, processing returns to step S102, and the processing of steps S102 to S106 is repeated. By repeating the processing of steps S102 to S106, the MCU 18 is sequentially input with digital values Vout corresponding to the cell voltages of each of the battery cells C.

In a case in which cell voltage measurement has been completed for all of the battery cells C, determination is affirmative at step S108, and the processing illustrated in FIG. 2 is ended.

In a case in which the instruction signal input to the controller 22 is a signal instructing operational state diagnosis, determination is negative at step S100, and processing proceeds to step S110.

At step S110, the controller 22 outputs control signals to the cell selector switch 24 to place all of the switches included in the cell selector switch 24 in an OFF state.

At the next step S112, the controller 22 outputs control signals to the switch SW1-2 and to the switch SW2-2 to place the switch SW1-2 and the switch SW2-2 in the OFF state.

At the next step S114, the controller 22 outputs control signals to the switch SW1-1 and the switch SW2-1 to place the switch SW1-1 and the switch SW2-1 in the ON state. When this has been performed, the operation illustrated in FIG. 2 is ended.

As a result of the operation performed at steps S112 and S114, the voltage $V_{01}$ input to the non-inverting input terminal of the first buffer amp 26 and the voltage $V_1$ output from the first buffer amp 26 are as expressed by the following Equation (1), in which r is the resistance of the resistor R.

$$V_{01} = VCCUP - (r \times Ix) = V_1 \qquad (1)$$

Note that in the present exemplary embodiment, the voltage $V_{01}$ expressed in Equation (1) is an example of a lowered voltage of the present disclosure. A value obtained by multiplying the resistance r by the current Ix (r×Ix) in the present exemplary embodiment is an example of a predetermined voltage of the present disclosure.

The voltage $V_{01}$ input to the non-inverting input terminal of the second buffer amp 28 and the voltage $V_2$ output from the second buffer amp 28 configure the voltage VCC input to the boosting circuit 36.

Accordingly, the output voltage $V_{1-2}$ output from the level shifter circuit 30 can be expressed by the following Equation (2).

$$V_{1-2} = V_1 - V_2 = VCCUP - (r \times Ix) - VCC \qquad (2)$$

In Equation (2), VCCUP-VCC corresponds to a boost voltage Vup that has been boosted by the boosting circuit 36. Equation (2) can thus be restated as the following Equation (3).

$$V_{1-2} = Vup - (r \times Ix) \qquad (3)$$

Accordingly, the boost voltage Vup can be expressed by the following Equation (4).

$$Vup = V_{1-2} + (r \times Ix) \qquad (4)$$

Note that, by setting the value obtained by multiplying the resistance r of the resistor R by the current Ix supplied by the constant current source 38 (r×Ix) as a lower limit of the boost voltage Vup in cases in which the boosting circuit 36 is operating normally, in an abnormal state in which the boost voltage Vup has dropped to the lower limit or lower, according to Equation (3), becomes $V_{1-2} \leq 0$. The digital value Vout output from the AD converter 32 therefore becomes 0 (Vout=0).

Note that, although a small current Ix enables the current consumption to be reduced, some time is required for the value of the voltage $V_{01}$ input to the non-inverting input terminal of the first buffer amp 26 to become stable. Accordingly, in cases in which the value obtained by multiplying the resistance r by the current Ix (r×Ix) is set as the lower limit for the boost voltage Vup, the specific values of the resistance r and the current Ix should be determined corresponding to the current consumption and the time required for the value of the voltage $V_{01}$ to stabilize.

In cases in which supply of the voltage VCCUP as the power source voltage of the first buffer amp 26 is not normal, the voltage $V_1$ output from the first buffer amp 26 may drop such that the voltage $V_1$ is equal to or lower than the voltage $V_2$. In such cases, the voltage $V_{1-2}$ output from the level shifter circuit 30 becomes 0 or lower ($V_{1-2} \leq 0$). Accordingly, in such cases, the digital value Vout output from the AD converter 32 becomes 0 (Vout=0), similarly to in cases in which the boosting circuit 36 is in an abnormal state.

In cases in which the boost voltage Vup is in a normal state, higher than the lower limit, according to Equation (3), becomes $V_{1-2} > 0$. Accordingly, the digital value Vout output from the AD converter 32 becomes a digital value corresponding to $V_{1-2}$.

Figure 3:
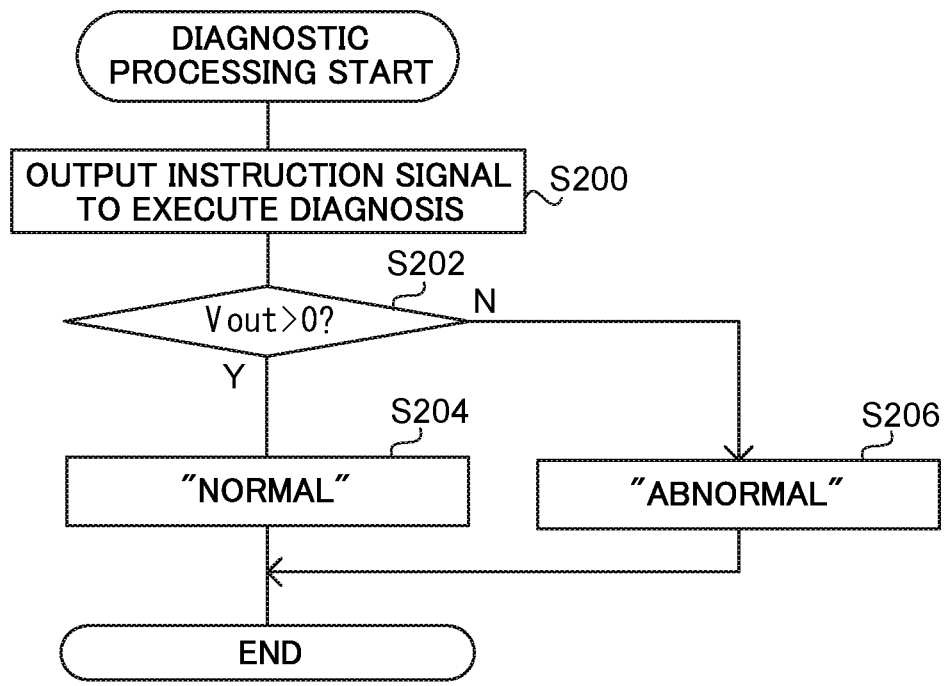
FIG. 3 is a flowchart illustrating a flow of diagnostic processing executed by an MCU of the first exemplary embodiment.

Explanation follows regarding operation of the MCU 18 in a case in which the operational state diagnosis is performed. Upon reaching a timing to perform the operational state diagnosis, the MCU 18 executes diagnostic processing, of which an example is illustrated in FIG. 3. Note that the timing at which the MCU 18 performs operational state diagnosis is not particularly limited, and, for example, operational state diagnosis may be performed regularly each time a predetermined interval has elapsed.

At step S200 illustrated in FIG. 3, the MCU 18 outputs the instruction signal described above to the cell voltage measurement circuit 20 in order to instruct operational state diagnosis. As described above, in response to this instruction signal, the cell voltage measurement circuit 20 performs operational state diagnosis under the control of the controller 22, and the digital value Vout output from the cell voltage measurement circuit 20 is input to the MCU 18.

At the next step S202, the MCU 18 determines whether or not the input digital value Vout is greater than 0 (Vout>0). In cases in which the digital value Vout is greater than 0, determination is affirmative at step S202, and processing proceeds to step S204.

In cases in which the boosting circuit 36 is in a normal operational state (namely, in the present exemplary embodiment, in cases in which the boost voltage Vup of the boosting circuit 36 is greater than the lower limit), the digital value Vout will be a digital value corresponding to the voltage $V_{1-2}$, as expressed by Equation (3). Accordingly, the MCU 18 diagnoses the operational state of the boosting circuit 36 to be normal at step S204, and then ends the diagnostic processing.

Note that, in the battery monitoring system 10, there is no particular limitation to the use of results of diagnosis made by the MCU 18. For example, the diagnostic results may be stored in a storage section (not illustrated in the drawings) or the diagnostic results may be reported to a predetermined device or to the exterior of the battery monitoring system 10. As another example, described later, the diagnostic results may be reported only in cases in which the diagnostic results reveal an abnormality.

In cases in which the digital value Vout is 0 or lower (Vout≤0), determination is negative at step S202 and processing proceeds to step S206.

As described above, in cases in which the boosting circuit 36 is in an abnormal operational state (namely, in the present exemplary embodiment, in cases in which the boost voltage Vup of the boosting circuit 36 is equal to or lower than the lower limit, or in cases in which the power source voltage supplied to the first buffer amp 26 is lower than the voltage VCCUP), the digital value Vout becomes 0, as described above. Accordingly, at step S206, the MCU 18 diagnoses at least one out of the operation of the boosting circuit 36 or the supply of the power source voltage VCCUP to the first buffer amp 26 to be abnormal, and then ends the diagnostic processing.

When the cell voltage measurement circuit 20 of the present exemplary embodiment performs a diagnostic operation in this manner, the non-inverting input terminal of the first buffer amp 26 is input with the voltage VCCUP, minus a voltage corresponding to the value obtained by multiplying the resistance r by the current Ix (r×Ix). The non-inverting input terminal of the second buffer amp 28 is input with the voltage VCC.

Accordingly, in the cell voltage measurement circuit 20 of the present exemplary embodiment, in cases in which the voltage $V_{1\text{-}2}$ output from the level shifter circuit 30 is equal to or lower than 0, it is possible to diagnose that at least one out of the operation of the boosting circuit 36 or the supply of the power source voltage VCCUP to the first buffer amp 26 is abnormal.

Accordingly, the cell voltage measurement circuit 20 of the present exemplary embodiment may diagnose an operational state of the cell voltage measurement circuit 20 in shorter time and with simple configuration.

Second Exemplary Embodiment

In the first exemplary embodiment, explanation was given regarding a configuration in which the cell voltage measurement circuit 20 diagnoses operation of the boosting circuit 36 and diagnoses a supply state of the power source voltage to the first buffer amp 26. In the present exemplary embodiment, explanation follows regarding a configuration in which a cell voltage measurement circuit 20 also diagnoses a supply state of a power source voltage to the second buffer amp 28.

In a battery monitoring system 10 of the present exemplary embodiment, the configurations of the battery cell assembly 14 and the MCU 18 are the same as those of the battery monitoring system 10 of the first exemplary embodiment, and explanation thereof is omitted.

Figure 4:
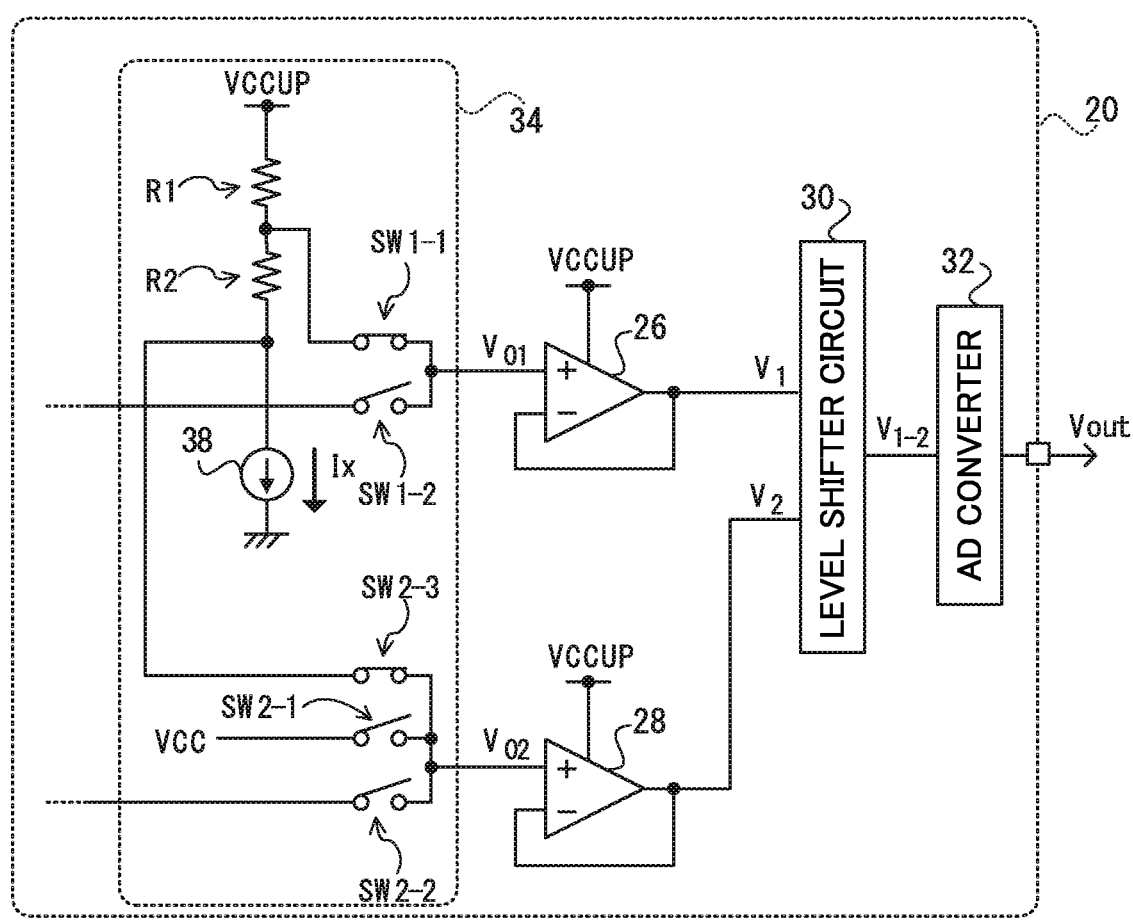
FIG. 4 is a configuration diagram schematically illustrating a configuration of a cell voltage measurement circuit in a battery monitoring system of a second exemplary embodiment.

FIG. 4 is a configuration diagram schematically illustrating an example of the cell voltage measurement circuit 20 of the battery monitoring system 10 of the present exemplary embodiment. Note that, in the cell voltage measurement circuit 20 of the present exemplary embodiment, the controller 22, the cell selector switch 24, and the boosting circuit 36 are similar to those in the cell voltage measurement circuit 20 of the first exemplary embodiment, and are therefore omitted from illustration in FIG. 4.

As illustrated in FIG. 4, a diagnostic circuit 34 of the cell voltage measurement circuit 20 of the present exemplary embodiment differs from the diagnostic circuit 34 of the cell voltage measurement circuit 20 of the first exemplary embodiment.

The diagnostic circuit 34 of the present exemplary embodiment includes a resistor R1, a resistor R2, a constant current source 38, a switch SW1-1, a switch SW1-2, a switch SW2-1, a switch SW2-2, and a switch SW2-3. The switch SW1-1 and the switch SW1-2 of the present exemplary embodiment configure an example of a first switching section of the present disclosure, and the switch SW2-1, the switch 2-2, and the switch SW2-3 of the present exemplary embodiment configure an example of a second switching section of the present disclosure.

One terminal of the resistor R1 is connected to the output of the boosting circuit 36 (to a power source line that supplies the voltage VCCUP). The other terminal of the resistor R1 is connected to one terminal of the resistor R2. The other terminal of the resistor R2 is connected to the constant current source 38. One terminal of the switch SW1-1 is connected between the resistor R1 and the resistor R2, in other words, to a connection node between the resistor R1 and the resistor R2. The other terminal of the switch SW1-1 is connected to the non-inverting input terminal of the first buffer amp 26. Similarly to in the first exemplary embodiment, the switch SW1-2 is connected between the cell selector switch 24 and the non-inverting input terminal of the first buffer amp 26. The switch SW1-1 and the switch SW1-2 of the present exemplary embodiment are ON/OFF controlled in response to control signals output from the controller 22, similarly to in the first exemplary embodiment.

Also similarly to in the first exemplary embodiment, the switch SW2-1 is connected between the input of the boosting circuit 36 and the non-inverting input terminal of the second buffer amp 28. Also similarly to in the first exemplary embodiment, the switch SW2-2 is connected between the cell selector switch 24 and the non-inverting input terminal of the second buffer amp 28.

The diagnostic circuit 34 of the present exemplary embodiment is also provided with the switch SW2-3. One terminal of the switch SW2-3 is connected between the resistor R2 and the constant current source 38, in other words, to a connection node between the resistor R2 and the constant current source 38. The other terminal of the switch SW2-3 is connected to the non-inverting input terminal of the second buffer amp 28.

The switch SW2-1, the switch SW2-2, and the switch SW2-3 are ON/OFF controlled in response to control signals output from the controller 22.

Figure 5:
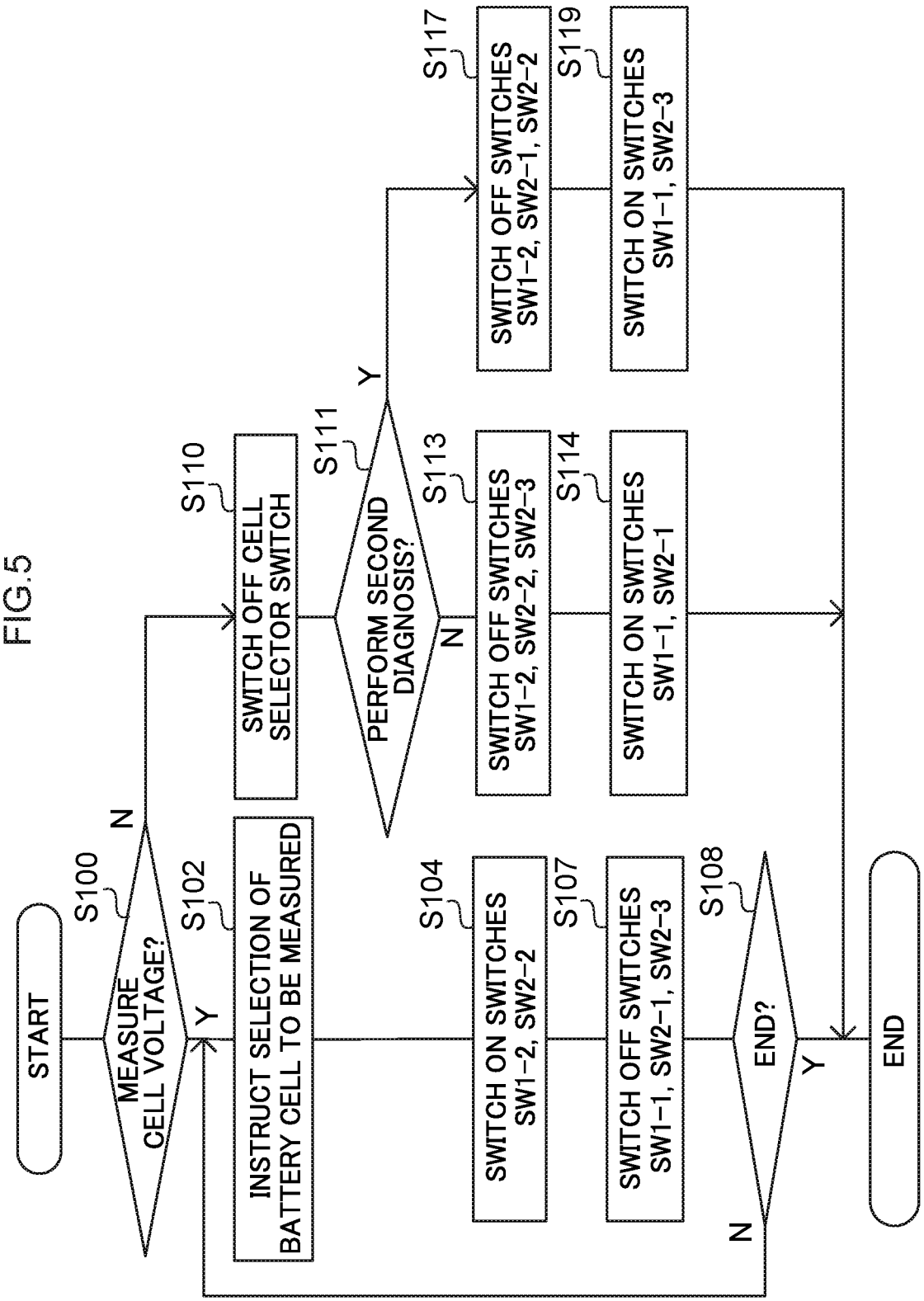
FIG. 5 is a flowchart illustrating a flow of processing of a controller of a cell voltage measurement circuit of the second exemplary embodiment.

Next, explanation follows regarding operation of the cell voltage measurement circuit 20 of the present exemplary embodiment. When input with an instruction signal output from the MCU 18, the controller 22 of the cell voltage measurement circuit 20 of the present exemplary embodiment executes processing, of which an example is illustrated in FIG. 5. Note that processing that is similar to the processing of the controller 22 of the first exemplary embodiment (see FIG. 2) is allocated the same step numbers, and detailed explanation thereof is omitted.

At step S100 illustrated in FIG. 5, the controller 22 determines whether or not the input instruction signal is a signal instructing cell voltage measurement. In cases in which the instruction signal is a signal instructing cell voltage measurement, determination is affirmative, and processing proceeds to step S102.

At step S102, the controller 22 outputs a control signal instructing selection of a battery cell C to be measured to the cell selector switch 24, and at the next step S104, the controller 22 outputs control signals to place the switch SW1-2 and the switch SW2-2 in an ON state. In the present exemplary embodiment, the controller 22 then executes the processing of step S107 in the place of step S106.

At step S107, the controller 22 outputs control signals to the switch SW1-1, the switch SW2-1, and the switch SW2-3 to place the switch SW1-1, the switch SW2-1, and the switch SW2-3 in an OFF state.

Similarly to the cell voltage measurement circuit 20 of the first exemplary embodiment, as a result of the processing of steps S102 to S107, the voltage $V_{O1}$ input to the non-inverting input terminal of the first buffer amp 26 corresponds to the high potential side voltage of the battery cell C to be measured, and the voltage $V_{O1}$ input to the non-inverting input terminal of the second buffer amp 28 corresponds to the low potential side voltage of the battery cell C to be measured. Accordingly, the output voltage $V_{1\text{-}2}$ corresponding to the battery cell C to be measured is output from the level shifter circuit 30 to the AD converter 32, and the digital value Vout corresponding to the battery cell C to be measured is output from the AD converter 32 to the MCU 18.

At the next step S108, the controller 22 determines whether or not to end cell voltage measurement. Accordingly, the cell voltages of all of the battery cells C included in the battery cell assembly 14 are measured in sequence.

In this manner, in the cell voltage measurement circuit 20 of the present exemplary embodiment, in cases in which the cell voltages of the battery cells C are measured, operation is similar to that of the cell voltage measurement circuit 20 of the first exemplary embodiment, except in the point that the switch SW2-3 is in the OFF state.

In cases in which the input instruction signal is a signal instructing diagnosis of the operation state of the boosting circuit 36 and the supply state of the power source voltage to the first buffer amp 26 (referred to hereafter as "first diagnosis"), or is a signal instructing diagnosis of the supply state of the power source voltage to the second buffer amp 28 (referred to hereafter as "second diagnosis"), the controller 22 makes negative determination at step S100, and processing proceeds to step S110.

At step S110, the controller 22 outputs control signals to place all of the switches included in the cell selector switch 24 in the OFF state. Then, in the present exemplary embodiment, the operation of step S111 is performed in the place of step S110.

At step S111, the controller 22 determines whether or not the input instruction signal is a signal instructing the second diagnosis. In cases in which the input instruction signal is a signal instructing the first diagnosis, determination is negative at step S111, and processing proceeds to step S113. At step S113, the controller 22 outputs control signals to the switch SW1-2, the switch SW2-2, and the switch SW2-3 to place the switch SW1-2, the switch SW2-2, and the switch SW2-3 in the OFF state.

At the next step S114, the controller 22 outputs control signals to place the switch SW1-1 and the switch SW2-1 in the ON state, and then ends the processing illustrated in FIG. 5.

As a result of the processing of steps S113 and S114, the voltage $V_{O1}$ input to the non-inverting input terminal of the first buffer amp 26 and the voltage $V_1$ output from the first buffer amp 26 are expressed by the following Equation (5), in which r1 is the resistance of the resistor R1.

$$V_{O1}=VCCUP-(r1\times Ix)=V_1 \quad (5)$$

The voltage $V_{O1}$ input to the non-inverting input terminal of the second buffer amp 28 and the voltage $V_2$ output from the second buffer amp 28 correspond to the voltage VCC input to the boosting circuit 36.

Accordingly, the output voltage $V_{1-2}$ output from the level shifter circuit 30 is expressed by the following Equation (6), and the boost voltage Vup is expressed by the following Equation (7).

$$V_{1-2}=Vup-(r1\times Ix) \quad (6)$$

$$Vup=V_{1-2}+(r1\times Ix) \quad (7)$$

Accordingly, similarly to in the cell voltage measurement circuit 20 of the first exemplary embodiment, by setting a value obtained by multiplying the resistance r1 of the resistor R1 by the current Ix supplied by the constant current source 38 (r1×Ix) as a lower limit of the boost voltage Vup, in an abnormal state in which the boost voltage Vup has dropped to the lower limit or lower, according to Equation (7), becomes $V_{1-2}$<0. The digital value Vout output from the AD converter 32 therefore becomes 0 (Vout=0).

Moreover, similarly to in the first exemplary embodiment, in cases in which the supply of the voltage VCCUP as the power source voltage to the first buffer amp 26 is not normal, the digital value Vout output from the AD converter 32 becomes 0 (Vout=0).

Likewise, similarly to in the first exemplary embodiment, in cases in which the boost voltage Vup is in a normal state, high than the lower limit, according to Equation (6), $V_{1-2}$>0. Accordingly, the digital value Vout output from the AD converter 32 becomes a digital value corresponding to $V_{1-2}$.

In cases in which the input instruction signal is a signal instructing the second diagnosis, the controller 22 makes affirmative determination at step S111, and processing proceeds to step S117. At step S117, the controller 22 outputs control signals to the switch SW1-2, the switch SW2-1, and the switch SW2-2 to place the switch SW1-2, the switch SW2-1, and the switch SW2-2 in the OFF state.

At the next step S119, the controller 22 outputs control signals to the switch SW1-1 and the switch SW2-3 to place the switch SW1-1 and the switch SW2-3 in the ON state, and the processing illustrated in FIG. 5 is then ended.

As a result of the processing of steps S117 to S119, the voltage $V_{O1}$ input to the non-inverting input terminal of the first buffer amp 26 and the voltage $V_1$ output from the first buffer amp 26 are expressed by Equation (5).

The voltage $V_{O1}$ input to the non-inverting input terminal of the second buffer amp 28 and the voltage $V_2$ output from the second buffer amp 28 are expressed by the following Equation (8), in which r2 is the resistance of the resistor R2.

$$V_{O2}=VCCUP-\{(r1+r2)\times Ix)\}=V_2 \quad (8)$$

Accordingly, the output voltage $V_{1-2}$ output from the level shifter circuit 30 is expressed by the following Equation (9).

$$V_{1-2}=V_1-V_2=VCCUP-(r1\times Ix)-VCCUP+ \\ \{(r1+r2)\times Ix\}=r2\times Ix \quad (9)$$

In cases in which supply of the voltage VCCUP as the power source voltage of the second buffer amp 28 is not normal, the voltage $V_2$ output from the second buffer amp 28 drops and the voltage $V_{1-2}$ output from the level shifter circuit 30 becomes greater than a value obtained by multiplying the resistance r2 of the resistor R2 by the current Ix (r2×Ix).

Figure 6:
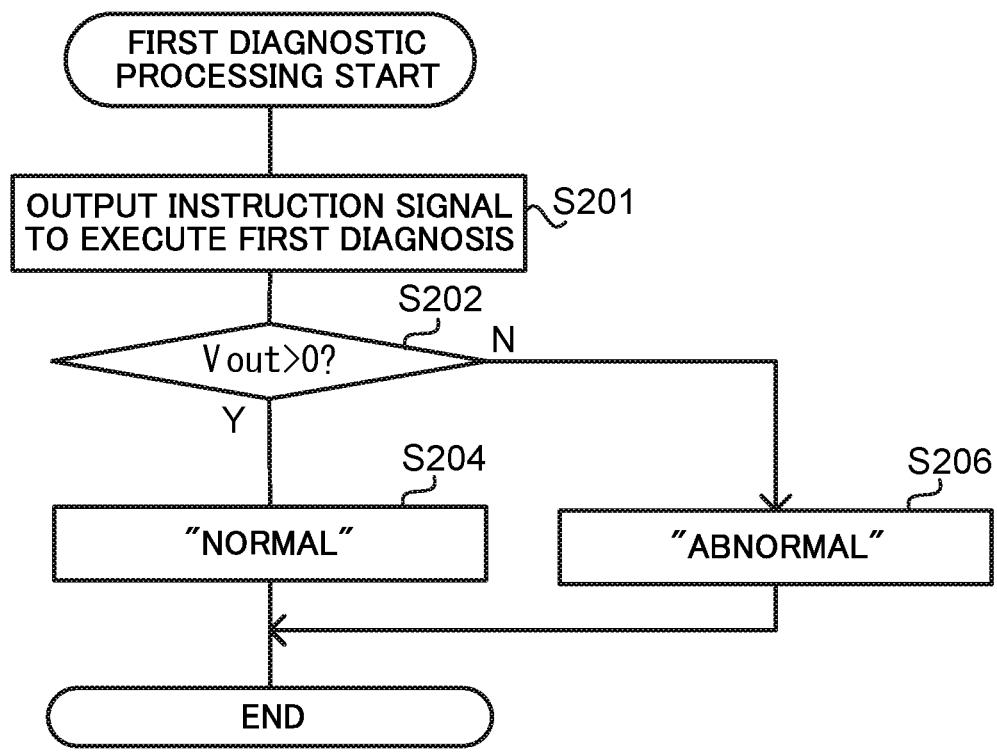
FIG. 6 is a flowchart illustrating a flow of first diagnostic processing executed by an MCU of the second exemplary embodiment.

Explanation follows regarding operation of the MCU 18 when performing the first diagnosis. Upon reaching a timing to perform the first diagnosis, the MCU 18 executes first diagnostic processing, of which an example is illustrated in FIG. 6. In the first diagnostic processing of the present exemplary embodiment illustrated in FIG. 6, the processing of step S201 is performed in place of step S200 of the diagnostic operation of the MCU 18 of the first exemplary embodiment (see FIG. 3).

At step S201, the MCU 18 outputs an instruction signal to the cell voltage measurement circuit 20 in order to instruct execution of the first diagnosis, and then processing proceeds to step S202. The processing of step S202 to S206 is similar to the diagnostic processing of the first exemplary embodiment (see FIG. 3), and so explanation thereof is omitted.

Figure 7:
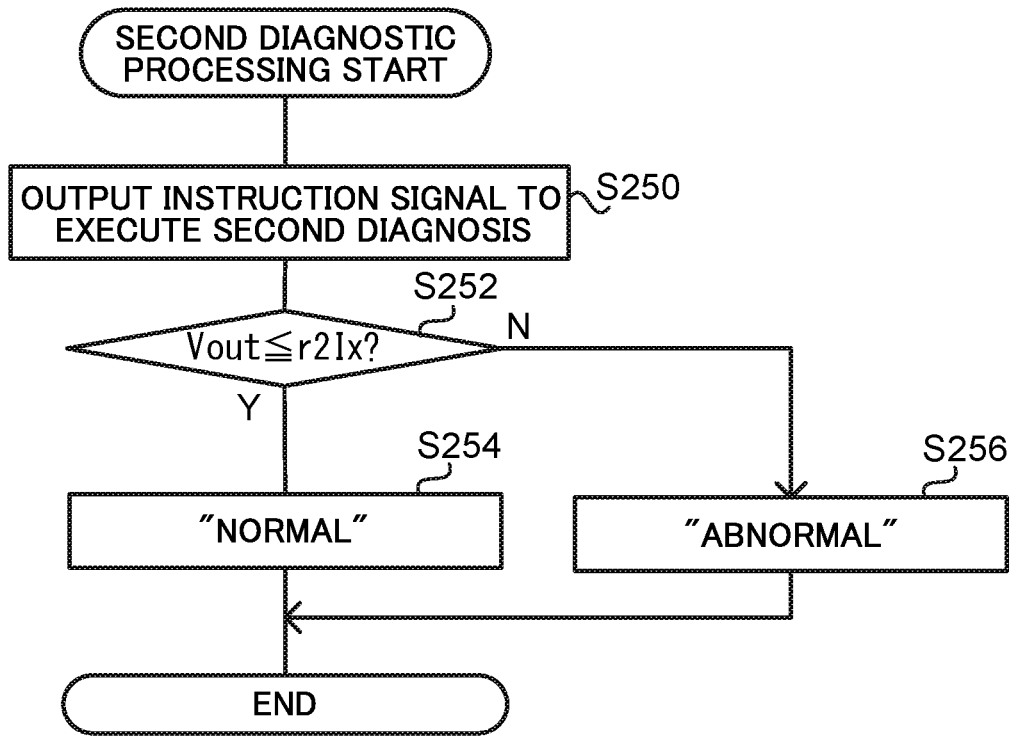
FIG. 7 is a flowchart illustrating a flow of second diagnostic processing executed by an MCU of the second exemplary embodiment.

Explanation follows regarding operation of the MCU 18 when performing the second diagnosis. Upon reaching a timing to perform the second diagnosis, the MCU 18 executes second diagnostic processing, of which an example is illustrated in FIG. 7. Note that the timing at which the MCU 18 performs the second diagnosis is not particularly limited, and, for example, may be the same as the timing at which the first diagnosis is performed, or may be a different timing thereto.

At step S250 illustrated in FIG. 7, the MCU 18 outputs an instruction signal to the cell voltage measurement circuit 20 as described above in order to instruct execution of the second diagnosis.

At the next step S252, the MCU 18 determines whether or not the input digital value Vout is equal to or lower than a digital value corresponding to the value obtained by multiplying the resistance r2 of the resistor R2 by the current Ix (r2×Ix). In cases in which the digital value Vout is equal to or lower than the digital value corresponding to the value obtained by multiplying the resistance r2 by the current Ix (r2×Ix), determination is affirmative at step S252, and processing proceeds to step S254.

In cases in which supply of the voltage VCCUP as the power source voltage of the second buffer amp 28 is normal, as described above, the voltage $V_{1-2}$ is greater than the value obtained by multiplying the resistance r2 by the current Ix (r2×Ix). Accordingly, in the cell voltage measurement circuit 20 of the present exemplary embodiment, the digital value Vout becomes greater than the digital value corresponding to the value obtained by multiplying the resistance r2 by the current Ix (r2×Ix).

Accordingly, the supply state of the power source voltage to the second buffer amp 28 is diagnosed as normal at step S254, and then the second diagnostic processing is ended.

In cases in which the digital value Vout is greater than the digital value of the value obtained by multiplying the resistance r2 by the current Ix (r2×Ix), determination is negative at step S252, and processing proceeds to step S256.

As described above, in cases in which the power source voltage supplied to the second buffer amp 28 is lower than the voltage VCCUP, the digital value Vout is equal to or lower than the digital value of the value obtained by multiplying the resistance r2 by the current Ix (r2×Ix). Accordingly, at step S256, the MCU 18 diagnoses the supply state of the power source voltage to the second buffer amp 28 to be abnormal, and then ends the second diagnostic processing.

In the cell voltage measurement circuit 20 of the present exemplary embodiment, when performing a first diagnosis operation, the non-inverting input terminal of the first buffer amp 26 is input with a voltage corresponding to the voltage VCCUP minus a value obtained by multiplying the resistance r1 by the current Ix (VCCUP−r1×Ix). The non-inverting input terminal of the second buffer amp 28 is input with the voltage VCC.

Accordingly, similarly to in the cell voltage measurement circuit 20 of the first exemplary embodiment, in the cell voltage measurement circuit 20 of the present exemplary embodiment, in cases in which the voltage $V_{1-2}$ output from the level shifter circuit 30 is equal to or lower than 0, it is possible to diagnose that at least one out of the operation of the boosting circuit 36 or the supply of the power source voltage VCCUP to the first buffer amp 26 is abnormal.

Moreover, in the cell voltage measurement circuit 20 of the present exemplary embodiment, when performing a second diagnosis operation, the non-inverting input terminal of the first buffer amp 26 is input with a voltage corresponding to the voltage VCCUP minus a value obtained by multiplying the resistance r1 by the current Ix (r1×Ix). The non-inverting input terminal of the second buffer amp 28 is input with a voltage corresponding to the VCCUP minus a value obtained by adding the current Ix by a value obtained by adding the resistance r1 and the resistance r2 together {VCCUP−(r1+r2)×Ix}.

Accordingly, in the cell voltage measurement circuit 20 of the present exemplary embodiment, in cases in which the voltage $V_{1-2}$ output from the level shifter circuit 30 is greater than a value obtained by multiplying the resistance r2 by the current Ix (r2×Ix), it is possible to diagnose that the supply of the power source voltage VCCUP to the second buffer amp 28 is abnormal.

Accordingly, the cell voltage measurement circuit 20 of the present exemplary embodiment may diagnose an operational state of the cell voltage measurement circuit 20 in shorter time and with simple configuration.

As described above, the cell voltage measurement circuit 20 of the exemplary embodiments described above includes: the boosting circuit 36 that outputs the voltage VCCUP boosted from the voltage VCC; the resistor R (R1) and the constant current source 38 that output a lowered voltage lowered from the voltage VCCUP by a predetermined voltage (VCCUP−r×Ix); the first buffer amp 26 that includes a non-inverting input terminal connected to the connection node between the resistor R and the constant current source 38 (connection node between the resistor R1 and the resistor R2); the second buffer amp 28 that includes a non-inverting input terminal that is input with the voltage VCC; and the level shifter circuit 30 that outputs a voltage corresponding to the difference between output of the first buffer amp 26 and output of the second buffer amp 28.

Due to having the above configuration, the cell voltage measurement circuit 20 of the battery monitoring system 10 of the present exemplary embodiment may diagnose an operational state of the cell voltage measurement circuit 20 in shorter time and with simple configuration.

Note that, in the exemplary embodiments described above, explanation has been given regarding a configuration in which the respective diagnoses are performed based on the digital value Vout output from the AD converter 32. However, there is no limitation thereto. The respective diagnoses may be performed based on the voltage $V_{1-2}$ output from the level shifter circuit 30.

Moreover, explanation has been given regarding configurations in which the diagnostic processing, or the first diagnostic processing and second diagnostic processing, of the exemplary embodiments described above are performed by the MCU 18. However, some or all elements of the above processing may be performed by sections other than the MCU 18, such as by the controller 22 of the cell voltage measurement circuit 20.

Explanation has been given regarding examples in which the resistor R of the first exemplary embodiment is an example of a resistor of the present disclosure, the resistor R1 of the second exemplary embodiment is an example of a first resistor of the present disclosure, and the resistor R2 of the second exemplary embodiment is an example of a second resistor of the present disclosure. However, there is no limitation thereto, and there is no limitation to the respective resistors so long as they are capable of applying a given resistance.

Obviously, other configuration, operation, and the like of the battery monitoring system 10, the cell voltage measurement circuit 20, and the diagnostic circuit 34 and the like described in the exemplary embodiments are merely examples, and may be modified as appropriate within a range not departing from the spirit of the present disclosure.

What is claimed is:
1. A semiconductor device comprising:
a cell selector switch connected to a battery cell assembly including a plurality of battery cells connected in series, the cell selector switch including a plurality of switching elements, each of the plurality of switching elements being turned ON and turned OFF to select a battery cell from among the plurality of battery cells in the battery cell assembly;

a first output section configured to output a first voltage;

a second output section configured to output a plurality of voltages;

a first switching section connected between the cell selector switch and the second output section, the first switching section being configured to be turned ON to supply a high potential side voltage of the selected battery cell to the second output section;

a second switching section connected between the cell selector switch and the second output section, the second switching section being configured to be turned ON to supply a low potential side voltage of the selected battery cell to the second output section;

a third switching section connected between the first output section and the second output section, the third switching section being configured to be turned ON to supply the first voltage to the second output section in a case in which the first switching section is turned OFF; and a fourth switching section including one end connected to the second output section, the fourth switching section being configured to be turned ON to supply a second voltage different from the first voltage to the second output section in a case in which the second switching section is turned OFF.

2. The semiconductor device of claim 1, wherein the second output section comprises:

a first buffer amp connected to the first switching section and the third switching section; and a second buffer amp connected to the second switching section and the fourth switching section.

3. The semiconductor device of claim 1, further comprising:

a resistor connected between the first output section and the third switching section; and a constant current source configured to supply a predetermined current, the constant current source including one end connected to a node between the resistor and the third switching section, wherein the first output section outputs the first voltage boosted from the second voltage, and wherein a third voltage that has been lowered from the first voltage by a predetermined voltage is supplied via the resistor to the second output section.

4. A battery monitoring system comprising:

the battery cell assembly;

the semiconductor device of claim 1, which is operated to measure a cell voltage of each of the plurality of battery cells; and a control device configured to output, to the semiconductor device, an instruction signal that instructs cell voltage measurement of each of the plurality of battery cells, and another instruction signal that instructs diagnosis of an operational state of the semiconductor device.

* * * * *